US 6,675,875 B1

(12) United States Patent  
Vafai et al.

(10) Patent No.: US 6,675,875 B1
(45) Date of Patent: Jan. 13, 2004

(54) MULTI-LAYERED MICRO-CHANNEL HEAT SINK, DEVICES AND SYSTEMS INCORPORATING SAME

(75) Inventors: Kambiz Vafai, Columbus, OH (US); Lu Zhu, Canton, MI (US)

(73) Assignee: The Ohio State University, Columbus, OH (US)

(*) Notice: Subject to any disclaimer, the term of this patent is extended or adjusted under 35 U.S.C. 154(b) by 119 days.

(21) Appl. No.: 10/078,627

(22) Filed: Feb. 19, 2002

Related U.S. Application Data

(60) Division of application No. 09/613,998, filed on Jul. 11, 2000, now abandoned, which is a continuation-in-part of application No. 09/369,564, filed on Aug. 6, 1999, now Pat. No. 6,457,515.

(51) Int. Cl.$^7$ .............................. F28F 7/00; F28F 3/12; H05K 7/20
(52) U.S. Cl. ...................... 165/80.4; 165/168; 361/699; 174/15.1
(58) Field of Search ................ 165/80.4, 168, 165/80.3, 185, 104.33; 361/699; 174/15.1

(56) References Cited

U.S. PATENT DOCUMENTS

| 3,708,223 | A |   | 1/1973  | Sorensen et al. ............ 165/168 |
| 3,884,558 | A |   | 5/1975  | Dunn, III et al. ............ 359/854 |
| 4,098,279 | A | * | 7/1978  | Golden ........................ 607/104 |
| 4,120,021 | A |   | 10/1978 | Roush ......................... 165/80.4 |
| 5,005,640 | A | * | 4/1991  | Lapinski et al. ............ 165/80.4 |
| 5,099,910 | A |   | 3/1992  | Walpole et al. ............ 165/80.4 |
| 5,203,401 | A | * | 4/1993  | Hamburgen et al. ........ 165/80.4 |
| 5,611,214 | A | * | 3/1997  | Weggeng et al. ............ 165/185 |
| 5,901,037 | A | * | 5/1999  | Hamilton et al. ............ 361/699 |
| 5,903,583 | A | * | 5/1999  | Ullman et al. ................ 372/35 |
| 6,457,515 | B1 | * | 10/2002 | Vafai et al. ................. 165/80.4 |

OTHER PUBLICATIONS

Missaggia et al., Microchannel Heath Sinks for Two Dimmensional High–Power–Density Diode Laser Arrays, IEEE Journal of Quantum Electronics 25, 1988–1992 (1989).
Weisberg et al., Analysis of Microchannels for Integrated Cooling, Int. J. Heat & Mass Transfer 35, 2465–74 (1992).
Tuckerman et al.. High–Performance Heat Sinking for VLSI, IEEE Electron Device Letter ED–2, 126–129, (1981).
Samalam, Convective Heat Transfer in Microchannels, J. of Electronics Materials 18, 611–17 (1989).
Bowers et al., Two–Phase Electronic Cooling Using Mini–Channel and Micro–Channel Heat Sinks: Part 1–to Design Criteria and Heat Diffusion Constraints, Trans. of the ASME, J. of Electronic Packaging 116, 290–7 (1994).
Knight et al., Heat Sink Optimization with Application to Microchannels, IEEE Trans. Components, Hybrids and Manufacturing Technology 15, 832–42 (1992).
Kleiner et al., High Performance Forced Air Cooling Scheme Employing Microchannel Heat Exchangers, IEEE Trans. on Components, Packaging and Manufacturing Technology Part A 18, 795–804 (1995).

* cited by examiner

Primary Examiner—Henry Bennett
Assistant Examiner—Tho Van Duong
(74) Attorney, Agent, or Firm—Standley Law Group LLP

(57) ABSTRACT

The present invention includes multi-layer micro-channeled heat sinks, multi-layer micro-channeled heat sink devices, and multi-layer micro-channeled heat sink systems. The invention also includes machines or electronic devices using these aspects of the invention. The present invention also includes an electronic device with multi-layered micro-channeled heat sink. The invention utilizes the multi-directional flow of coolant through the individual heat sink layers so as to minimize heat gradients. The present invention is also capable of reducing the undesirable temperature variation in the streamwise direction for the micro-channel heat sink instead of increasing the pressure drop.

15 Claims, 11 Drawing Sheets c) z=L

MULTI-LAYERED MICRO-CHANNEL HEAT SINK, DEVICES AND SYSTEMS INCORPORATING SAME

This application is a divisional application of application Ser. No. 09/613,998 filed Jul. 11, 2000 abandoned that was a continuation-in-part application of application Ser. No. 09/369,564 filed Aug. 6, 1999 now U.S. Pat. No. 6,457,515.

TECHNICAL FIELD OF THE INVENTION

The present invention is in the field of electronic cooling and temperature regulation.

BACKGROUND OF THE INVENTION

This invention relates to heat sink apparatus useful in electronic devices. More specifically, this invention relates to the removal of heat from microelectronics that are useful in computerized devices The problem of heat removal has become an important factor in the advancement of microelectronics, due to drastically increased integration density of chips in digital devices as well as an increased current-voltage handling capability of power electronic devices. The task of removing a large amount of dispersed heat from a constrained, small space is often beyond the capability of conventional cooling techniques. New methods with heat removal capabilities at least one order larger than that of conventional ones are therefore required.

Although described with respect to the fields of computers and microelectronics, it will be appreciated that similar advantages of a high performance and compact cooling scheme may be realized in other applications of the present invention. Such advantages may become apparent to one of ordinary skill in the art in light of the present disclosure or through practice of the invention.

SUMMARY OF THE INVENTION

The present invention includes heat sinks, heat sink devices, and heat sink systems. The present invention may also be used as a heat source, a heat source device, and in heat source systems, in accordance with methods of heat transfer known to one skilled in the art. The invention also includes machines or electronic devices using these aspects of the invention. The present invention may also be used to upgrade, repair or retrofit existing machines or electronic devices or instruments of these types, using methods and components known in the art.

The present invention is based on a multi-layer micro-channel heat sink design. Micro-channel heat sink has been studied and tested as a high performance and compact cooling scheme in microelectronics cooling applications. It is shown that the thermal resistance as low as 0.03° C./W is obtainable for micro-channel heat sinks, which is substantially lower than conventional channel-sized heat sinks. Design factors that have been studied include coolant selection (air and liquid coolant), inclusion of phase change (one phase and two phase), and structural optimization.

One drawback of micro-channel heat sink is the relatively higher temperature rise along the micro-channels compared to that for the traditional heat sink designs. In the micro-channel heat sink the large amount of heat generated by semiconductor chips is carried out from the package by a relatively small amount of coolant, the coolant thereby exiting at a relatively high temperature.

This undesirable temperature gradient is an important consideration in the design of an electronic cooling scheme. A large temperature rise produces thermal stresses in chips and packages due to the coefficient of thermal expansion (CTE) mismatch among different materials thus undermining device reliability. Furthermore, a large temperature gradient is undesirable for the electrical performance since many electrical parameters are adversely affected by a substantial temperature rise. For instance, in power electronic devices electrical-thermal instability and thermal breakdown could occur within a high temperature region.

In one-layered micro-channel heat sink design, increasing the pressure drop across the channels can control bulk temperature rise along the channels. A larger pressure drop forces coolant to move faster through the channel. This requires a more powerful pumping power supply, generating more noise, and requiring bulkier packaging. Multi-phase micro-channel heat sink is an alternative method for eliminating the temperature variations, in which the utilization of latent heat can achieve a uniform temperature profile on the heating surface. However, a multi-phase scheme can have several drawbacks, such as a complicated structure and a much larger pressure drop required for the gas-liquid mixture to flow inside the minute conduits.

The present invention reduces the undesired temperature variation in the streamwise direction for the micro-channel heat sink by a design improvement, instead of increasing the pressure drop. The design in the present invention is based upon stacking multiple layers of micro-channel heat sink structures, one atop the other, with coolant flowing in different directions in each of the adjacent micro-channel layers. For such an arrangement, streamwise temperature rise for the coolant and the substrate in each layer may be compensated through conduction between the layers, resulting in a substantially reduced temperature gradient. The flow loop can be similar to the one designed for the one-layered micro-channel heat sink, except that the flow loop should branch to allow the coolant to flow from different directions, or the same direction, into each of the layers.

In the present invention, the thermal performance of the proposed multi-layered micro-channel heat sink is examined numerically using a finite element method. Optimization issues for design parameters are addressed as well. Although a one-layered micro-channel heat sink has been extensively studied, the proposed multi-layered structure concept has never been reported.

The present invention includes a multi-layered micro-channeled heat sink for use with a heat-generating surface. The heat sink has at least one first layer having a plurality of micro-channels. One of these first layers is in thermal contact with the heat-generating surface. The heat sink also has at least one second layer comprising a plurality of micro-channels. Each second layer is in thermal contact with at least one first layer. Preferably, the layers alternate between first and second layers. The heat sink also comprises a device for circulating a coolant through these layers. The coolant preferably flows through each first layer in a common direction and through each second layer in a direction opposite that common direction.

Also included in the present invention is a multi-layered micro-channeled heat sink for use in conjunction with heat-generating surface. The heat sink contains multiple layers, each layer comprised of several micro-channels. Each layer is in thermal contact with at least one other layer. One of the layers is also in thermal contact with the heat-generating surface. The heat sink includes a device for circulating a coolant or other heat-transferable fluid through these layers, such that coolant flows through at least two of the layers in different directions. Preferably, coolant flows through each adjacent layer in a different direction.

The present invention also includes an electronic device with multi-layered micro-channeled heat sink. The device includes electronic circuitry capable of generating heat. The device contains a plurality of layers, each layer comprised of a plurality of micro-channels. Each layer is in thermal contact with at least one other layer, and one of the layers is also in thermal contact with the electronic circuitry. The electronic device also includes a device for circulating a coolant through the layers, such that the coolant flows through at least two of the layers in different directions.

The heat sink or electronic device may be made of any appropriate material consistent with its intended function as reflected in the present disclosure. For instance, the channel walls may be made of silicon. The systems can be augmented by the addition of any related device, including a cooling or heating device, a heat exchange device, a coolant or heating fluid filter, a coolant or heating fluid reservoir, and/or a flow-generating device. Typically, the dimensions of the individual micro-channels should be less than one-sixteenth of an inch in height and width, and comparable to the size of the heat generating or heat absorbing substrate in length. EDM is an example of a technique that may be used to create these micro-channels, among other methods of micro machining known to one of ordinary skill in the art. Coolant, as used in this disclosure, refers to any liquid, gel, or other flowable material that is capable of transferring heat to or from a specified device. Flowing coolant may be used to transfer heat from a device, thereby cooling it, or to a device, thereby heating it.

DETAILED DESCRIPTION OF THE PREFERRED EMBODIMENT(S)

Figure 1A:
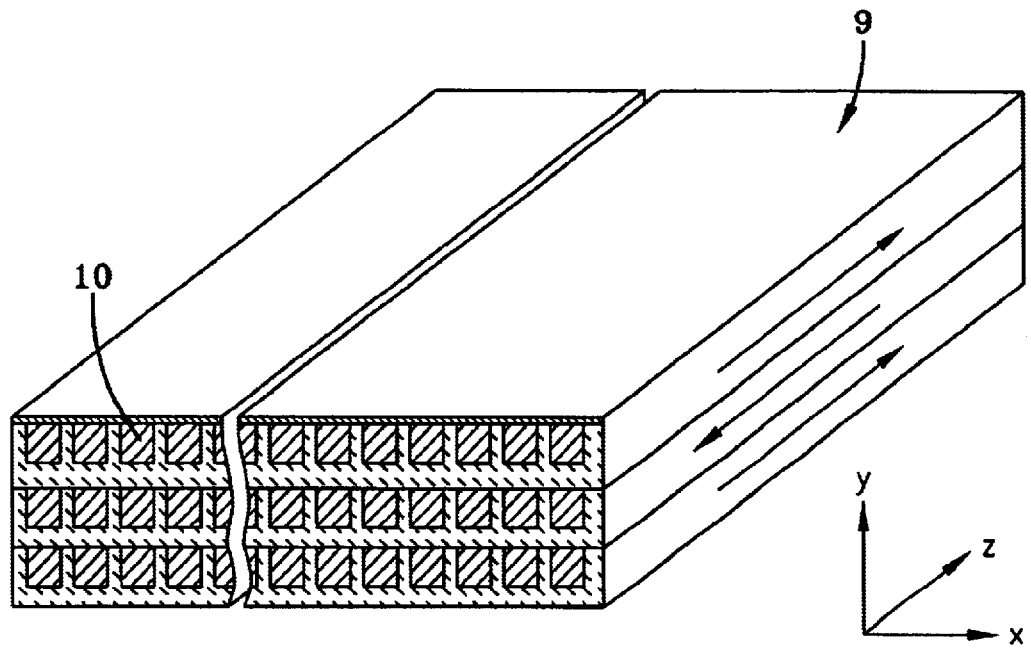
FIG. 1 is (a) a schematic for three-layered micro-channel heat sink concept and (b) shows one embodiment of the cooling set-up for the proposed three-layered structure in accordance with one embodiment of the present invention.
Figure 1B:
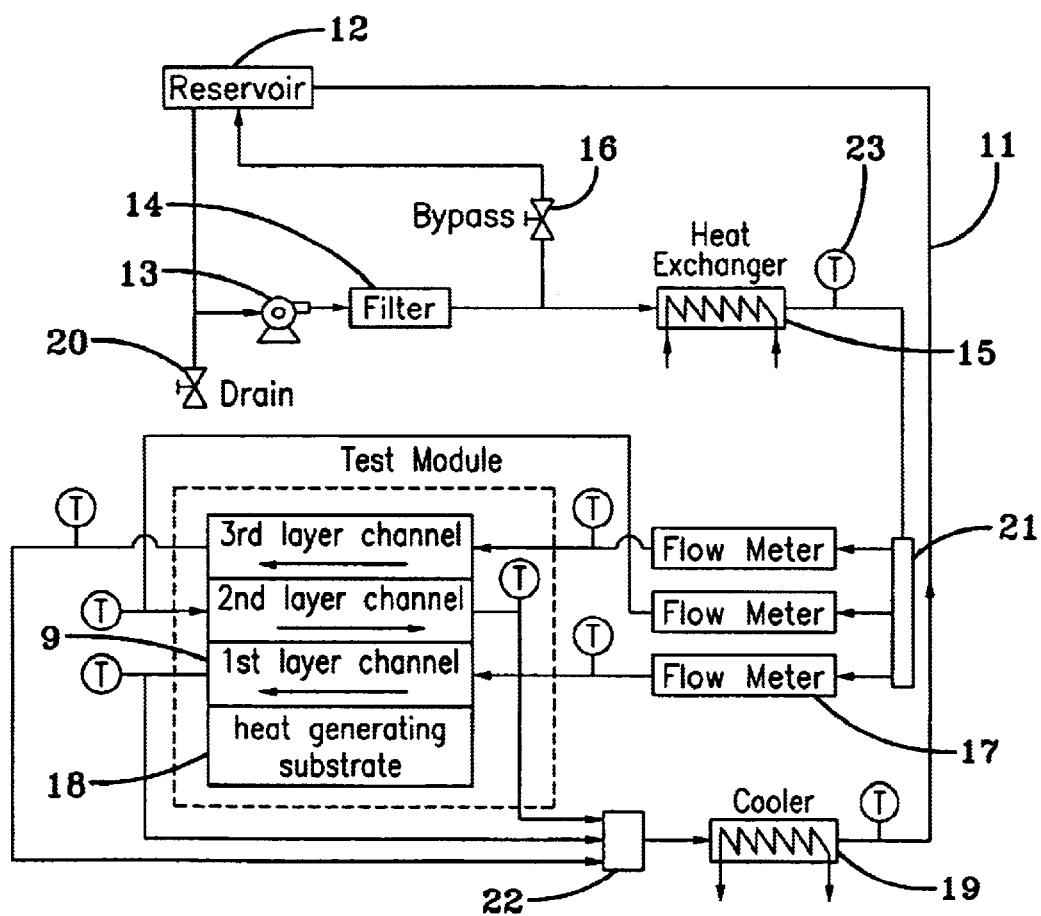

FIG. 1(a) shows a preferred multi-layer heat sink 9 comprising three layers, each layer comprised of several micro-channels 10. The heat sink 9 may be made from a conductive or semi-conductive material such as silicon. The cooling setup 11 for the preferred two-layered heat sink 9 is shown in FIG. 1(b). Coolant is drawn from a coolant reservoir 12 by a flow-transporting device 13. The coolant is passed through a coolant filter 14 to either a heat exchanger 15 or through a bypass valve 16 back to the reservoir 12. Coolant passing through the heat exchanger 15 is then bifurcated into two separate paths of flow, each path passing coolant through a separate flow meter 17. For devices with more layers, the flow may branch into multiple paths by flow splitter 21. Each flow path is then passed through one of the layers of the heat sink 9, which is in thermal contact with a heat-generating substrate 18. The heat-generating substrate 18 may comprise electric circuitry capable of generating heat. After passing through the micro-channels of each layer, the flow of coolant is combined by flow combiner 22, the flow of coolant the passes through a cooler 19 and is then sent back to the coolant reservoir 12. A drain 20 is also provided to allow the changing of coolant. A series of thermocouples 23 monitor the temperature of the coolant at various locations through out the cooling set-up. The ratio of coolant volume flow rate through each layer may be varied.

It should be recognized that the device is not limited to two layers, and in fact may have several stacked layers. It is preferred that no adjacent layers have coolant flowing in a common direction, so as to minimize the presence of heat gradients in the heat generating substrate. Since each channel may have coolant flowing in one of two opposing directions, and the channels in each layer do not necessarily need to be parallel to those of an adjacent layer, there may also be multiple directions of flow. For instance, in a square heat sink a given layer may have micro-channels positioned perpendicular to or opposite to the direction of micro-channels in an adjacent layer. Since flow may go through the micro-channels in either direction, the presence of perpendicular channels provides for the possibility of 4 directions of flow through the heat sink. It should be recognized that the number of directions of flow is limited only by practicality.

In manufacturing the micro-channeled heat sink, equipment and techniques may be used that are similar to those developed and employed in the electronics semiconductor industry. One such technique that may be used to manufacture the heat sinks is silicon surface micro-machining. In a preferred example of this technique, layers of a sacrificial material such as an oxide are deposited on the surface of a silicon wafer at the location of the grooves of the heat sink. Polysilicon may be used as a structural material that is then deposited on the wafer structure, where the walls of the heat sink are located, and then etched to form the grooves and the walls. Two silicon wafers may then be bonded together using wafer-bond or other appropriate techniques. The top surface of the first layer may be covered by bonding a top layer of a polysilicon or other appropriate substrate. The wafer structure may then be cut and packaged into the final design. ps Materials and Methods Optimization of the Heat Sink: The parameters that are used to evaluate the thermal performance of a heat sink are the normal and the streamwise thermal resistances. The normal thermal resistance is defined as $$R^n_{th} = \Delta T^n_{max}/q$$

where $\Delta T^n_{max}$ is the maximum temperature rise from the coolant in the bottom channel to the bottom surface of the heat sink that is attached to the heat-generating chips and q is the heat flux at the bottom surface. The streamwise thermal resistance is related to the rate of the streamwise temperature gradient and the applied heat flux, and is defined by $$R^z_{th} = \Delta T^2_{max}/q$$

where $\Delta T^2_{max}$ denotes the maximum temperature increase along the z direction on the bottom surface of the silicon.

The task of optimization is to find the optimal design parameters that would minimize the cited two thermal resistances in the normal and streamwise directions. Pertinent geometrical parameters related to the thermal performance of a two-layered micro-channel heat sink are the ratio of channel height to channel width, the ratio of fin width to the channel width, the size of the channels, and the streamwise channel length of the heat sink. It has been established that in the one-layered structure, smaller channel size and larger ratio of channel height to width can reduce the normal thermal resistance, as long as such a design will satisfy the structural consideration. These observations are also valid for two-layered structures. It has been reported that the optimal ratio of channel width to fin width is about 1.0 for the one-layered structure. This result may not be true for a two-layered design because the heat dissipation pattern through the channel and the fin, as discussed previously, are quite different between the one-layered and two-layered structures.

Figure 7:
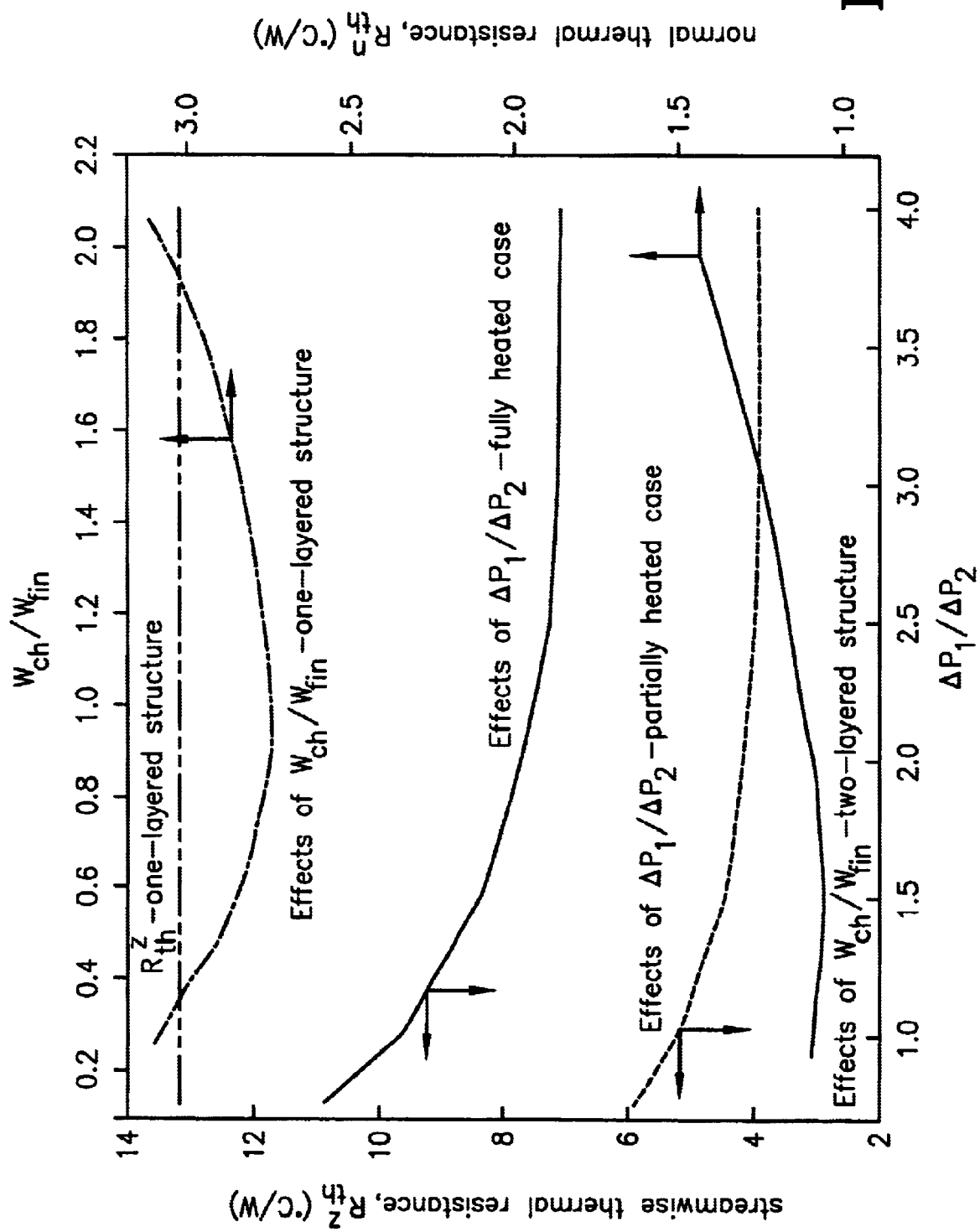
FIG. 7 shows the effects of $W_{ch}/W_{fin}$ and $\Delta P_1/\Delta P_2$, on the normal and streamwise thermal resistances in accordance with the present invention.

The effects of the $w_{ch}/w_{fin}$ on the normal thermal resistance, $R^n_{th}$, is shown in FIG. 7 for both the two-layered and the one-layered structures under the same operating conditions. It should be noted that $w_{ch}/w_{fin}$ variations did not have a significant impact on the streamwise thermal resistance, $R^n_{th}$. In the two-layered structure, the minimum $R^n_{th}$ is obtained at the $w_{ch}/w_{fin}$ ratio of 0.6, compared to 1.0 for the one-layered structure. This means that the fins for an optimal two-layered micro-channel heat sink may be thicker than the fins of the one-layered structure having the same patch width. The reason for this difference in fin thickness is that the fin for the bottom layer in the two-layered structure transports a higher percentage of heat (to both the bottom and top channels) than the fin for the one-layered structure; and a thicker fin apparently facilitates this heat transfer. It should be noted that the normal thermal resistance varies only slightly in the range of $w_{ch}/w_{fin}$ less than 0.6. Considering the difficulty of fabrication of smaller channels, $w_{ch}/w_{fin}$ of 0.6 is therefore recommended as the optimal ratio for the practical design of a two-layered micro-channel heat sink.

The effects of the ratio of the pressure drops in the bottom and top layer, $\Delta P_1/\Delta P_2$ on the streamwise thermal resistance, $R^z_{th}$, for both the one-layered and two-layered structures are also plotted in FIG. 7. It should be noted that $\Delta P_1/\Delta P_2$ variations did not have a significant impact on the normal thermal resistance, $R^n_{th}$. In order to compare the two cases, the same heat flux is again used for both cases and the flow rate used for the one-layered case is set equal to the sum of the flow rates in the top and the bottom layers for the two-layered case. It should be noted that for the one-layered channels, the amount of heat carried out by the coolant flow is proportional to the flow rate, which in turn is proportional to the pressure drop applied across the channels. For the two-layered channels, given the total amount of the flow rate of coolant in both channels, it requires knowledge of the optimal pressure drop ratio that can minimize the streamwise thermal resistance. It can be observed in FIG. 7 that as $\Delta P_1/\Delta P_2$ increases from 0.7 to about 3.0, the streamwise thermal resistance rate decreases significantly from 17.2° C./cmW to 11.40° C./cmW Further increase of this pressure ratio does not significantly reduce the thermal resistance. Based on this fact, a pressure ratio of 2.5–3.0 is recommended as an optimal ratio for a practical two-layered design. This optimal pressure ratio is also found to hold true for the partially heated cases as shown in FIG. 7.

Figure 8:
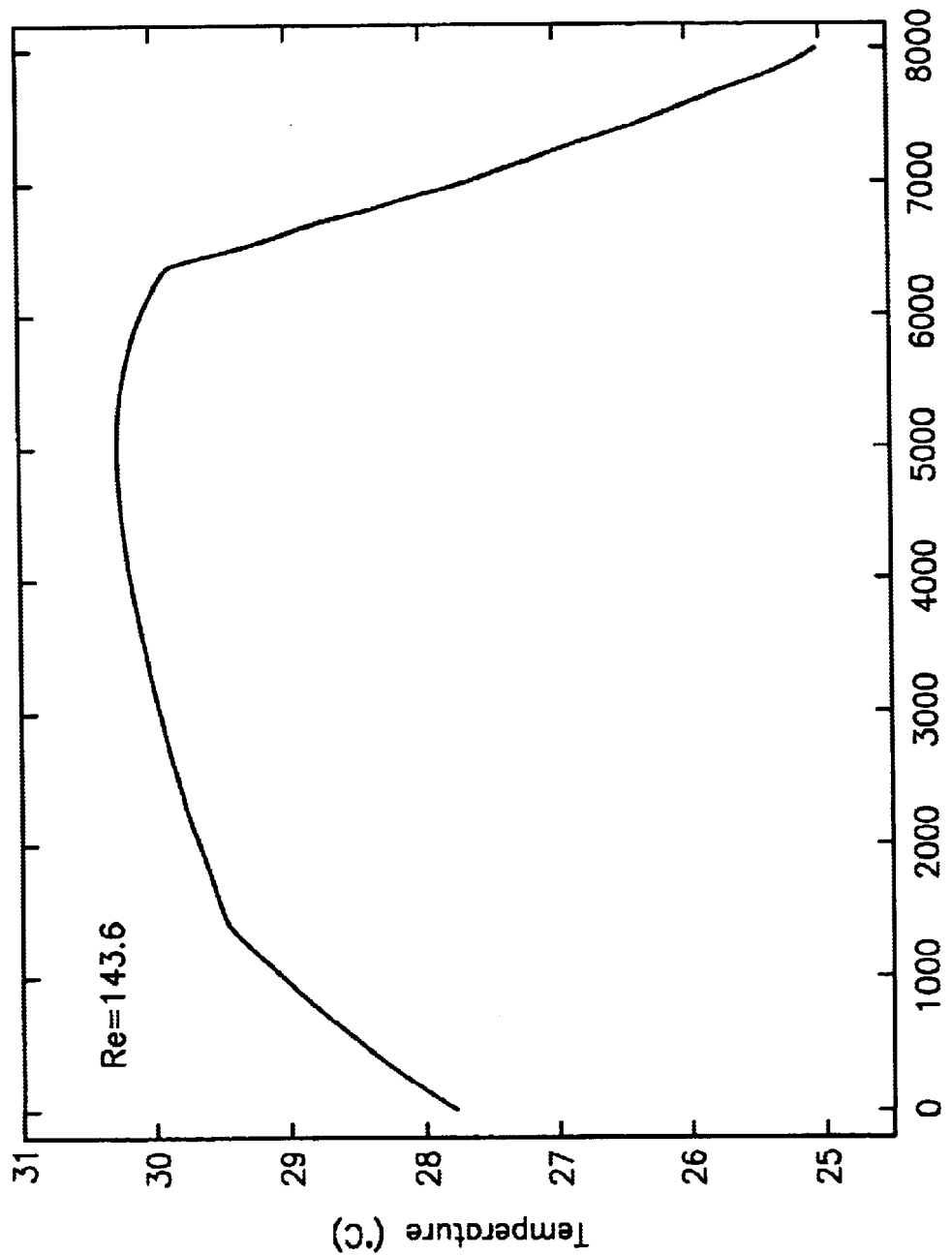
FIG. 8 shows the streamwise temperature distribution for partially heated cases in accordance with the present invention.
Figure 9:
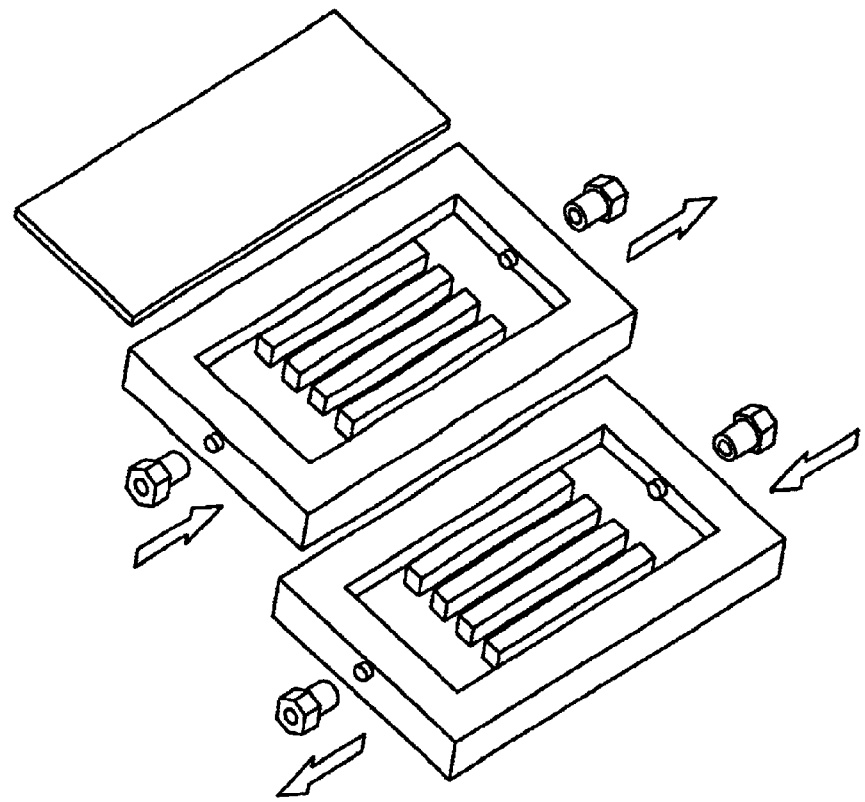
FIG. 9 is an exploded perspective view of another multi-layered micro-channel heat sink in accordance with one embodiment of the present invention.
Figure 10:
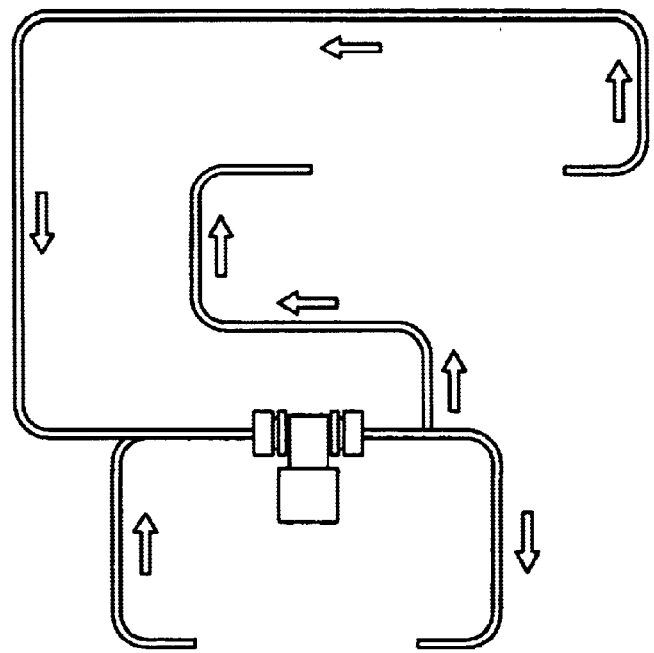
FIG. 10 is a front view of a feeding mechanism that may be used in conjunction with the multi-layered micro-channel heat sink of FIG. 9 in accordance with the present invention.

Another geometric parameter that can be optimized in the design of a two-layered micro-channel heat sink is the channel length. The streamwise temperature distribution in FIG. 6 indicates that a large portion of the temperature rise occurs at the two ends of the channels. This is due to relatively intense heat transfer between the low-temperature coolant of one layer at its inlet and the high-temperature coolant of the opposite layer at its outlet, within a short distance. This implies that the two-layered micro-channel can be constructed with a longer length in the streamwise direction, so that the heat-generating semiconductor chips can be mounted in the mid section of the heat sink to avoid the two high temperature gradient regions at both ends of the channels. This idea is implemented in our calculations by modifying the boundary condition at the bottom of the heat sink to one of partial heating, specifically, three-fifth of the total length at the mid section of the channel is exposed to heat flux. FIG. 8 shows the streamwise temperature distribution at x=40 and y=0 (at the bottom surface) of this partially heated case. The overall channel length is kept at 8000 $\mu$m, which is the same as the length used for the fully heated case. The heated region is restricted from z=1600 $\mu$m to z=6400 $\mu$m. All other parameters are kept the same as for the fully heated case discussed previously. The temperature increases from 27.6° C. to 29.5° C. and decreases from 29.7° C. to 25.0° C. within the two end regions. In the heated region where the semiconductor chip is mounted, the temperature variation is only about 0.5° C. This demonstrates that a longer micro-channel design can indeed substantially reduce the streamwise temperature variation. It should be pointed out that the one-layered design does not have these characteristics. A longer channel length in the one-layered structure will not affect the streamwise temperature rise due to the absence of the heat transfer mechanism between the coolant flows within the top and the bottom layers.

Discussion

Figure 2:
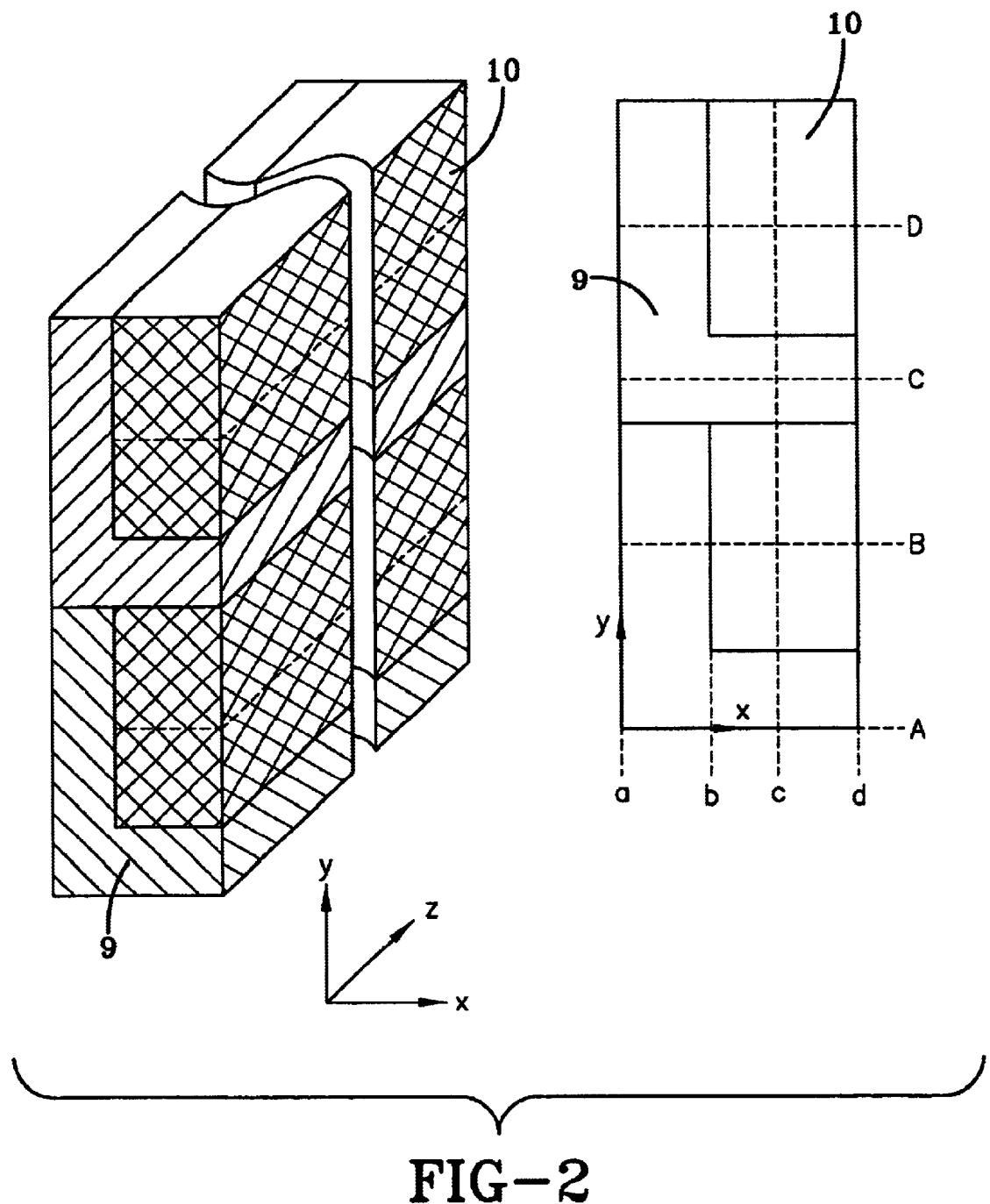
FIG. 2 shows the computational domain based on symmetry considerations in accordance with the present invention.

As shown in FIG. 2, the heat sink has two layers of rectangular channels and fins. The width and height of each of the channels are $2W_{ch}$ and $H_{ch}$ respectively. The width and height of each of the vertical fins are $2W_{fin}$ and $H_{ch}$ and the width and height of each of the horizontal fins are $2(W_{fin}+W_{ch})$ and $H_{ba}$. respectively. The length of the channel in the streamwise direction is L. Flow in the bottom channel is along the z direction and flow in the top channel is opposite to the z direction.

Previous numerical works on the one-layered micro-channel heat sink are mostly based on a two-dimensional model. However, a three-dimensional model is necessary in this work because the temperature distribution in the two-layered structure is expected to be three-dimensional, along with a non-linear distribution in a streamwise direction. For the fin region shown in FIG. 2, the three dimensional conduction equation with constant thermal conductivity as given below is utilized.

$$\nabla^2 T = 0$$

The flow in each of the micro-channels is assumed to be unidirectional. That is, the inlet and outlet hydraulic effects may be neglected. This assumption can be justified by noting that the inlet and the outlet dimensions of the micro-channel's cross section are at least one order of magnitude less than the length of the channel. This allows the attainment of an analytical expression for the velocity profile. The temperature distribution within the micro-channel can then be obtained from the following energy equation $$\rho c_p(\partial T/\partial z) = k\nabla^2 T + \mu[(\partial w/\partial x)^2 + (\partial w/\partial y)^2]$$

where w is the streamwise velocity component. As mentioned before, the velocity distribution inside the channel, w, can be obtained analytically as $$w(x, y) = \left(48/\Pi^3\right)\sum_{i=1}^{\infty}(-1)^{i-1}$$

$$\{1 - (\cosh[\Pi(2i-1)x/H_{ch1,2}]/\cosh[\Pi(2i-1)W_{ch}/H_{ch1,2}])\} *$$

$$\{\cosh[\Pi(2i-1)W_{ch}/H_{ch1,2}]/(2i-1)^2\}/\left\{1 - (96/\Pi^5)\right.$$

$$\left(H_{ch1,2}/W_{ch}\right)\sum_{j=1}^{\infty}(\tanh[\Pi(2i-1)W_{ch}/H_{ch1,2}]/(2i-1)^5)\right\}$$

where the average velocity is given by $$\bar{w} = -(H_{ch1,2}^2/12\Pi)(dp/dz)$$

$$\left\{1 - (96/\Pi^5)(H_{ch1,2}^\infty/W_{ch})\sum_{j=1}^{\infty}(\tanh[\Pi(2i-1)W_{ch}/H_{ch1,2}]/(2i-1)^5)\right\}$$

and where $W_{ch}$ is the channel width and $H_{ch1,2}$ is the channel height for either the lower or upper layer.

Based on the symmetry conditions, the central surface of the fin and the channel are taken as adiabatic. The top surface of the system is assumed to be adiabatic as well, because thermally insulated materials usually cover it. A uniform heat flux, q is applied to the bottom of the composite micro-channel which is attached to the heat generating chip. The coolant is assumed to enter each of the micro-channels at a constant temperature. Adiabatic conditions are utilized at the exits of each of the micro-channels. This is because conductive heat transfer at the exit is estimated to be less than 1% of the imposed heat transfer at the bottom surface. The micro-channel heat sink is presumably made of silicon, and water is used as the coolant.

The Reynolds Number (Re) is defined in the usual manner as $$Re = \rho w D_{1,2}/\mu$$

where $D_{1,2}$ are the hydraulic diameters of the lower and the upper channels, respectively, which are defined by $$D_{1,2} = (4 W_{ch}H_{1,2})/(W_{ch}H_{ch1,2})$$

The numerical scheme is based on the finite element discretization using Galerkin Method of weighted residuals. Eight-node iso-parametric brick elements are used in the computations. A normal case ran for about four hours on a R-10000 silicon graphic workstation.

Figure 3A:
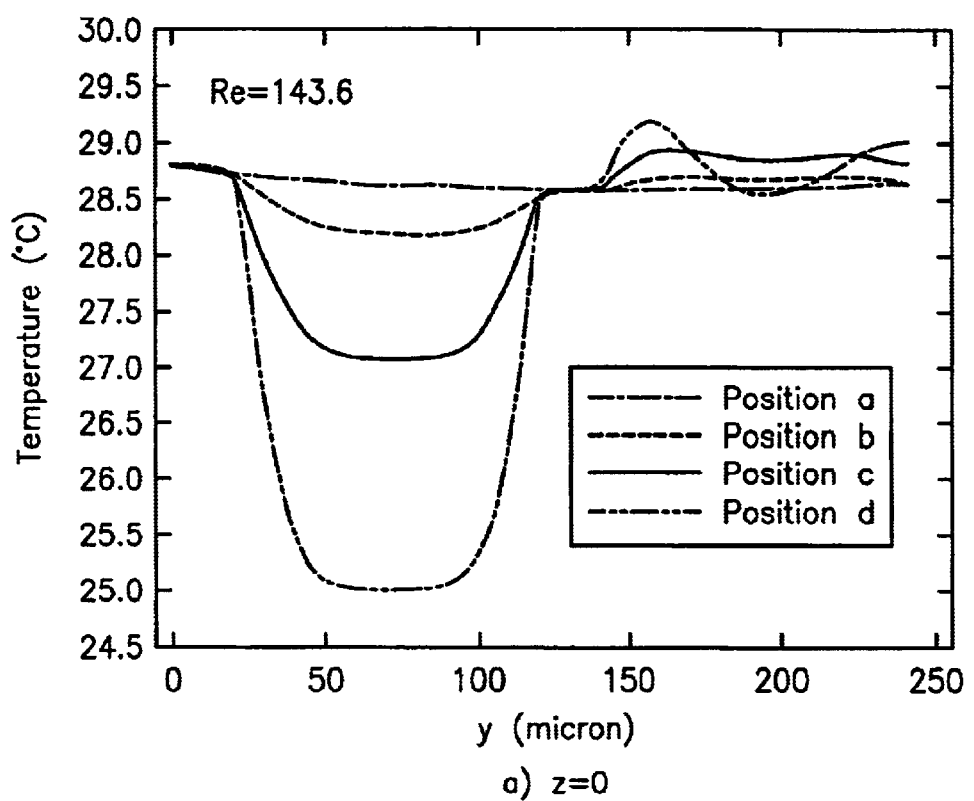
FIG. 3 shows the temperature distribution in normal (y) direction at different x and z locations in accordance with the present invention.
Figure 3A:
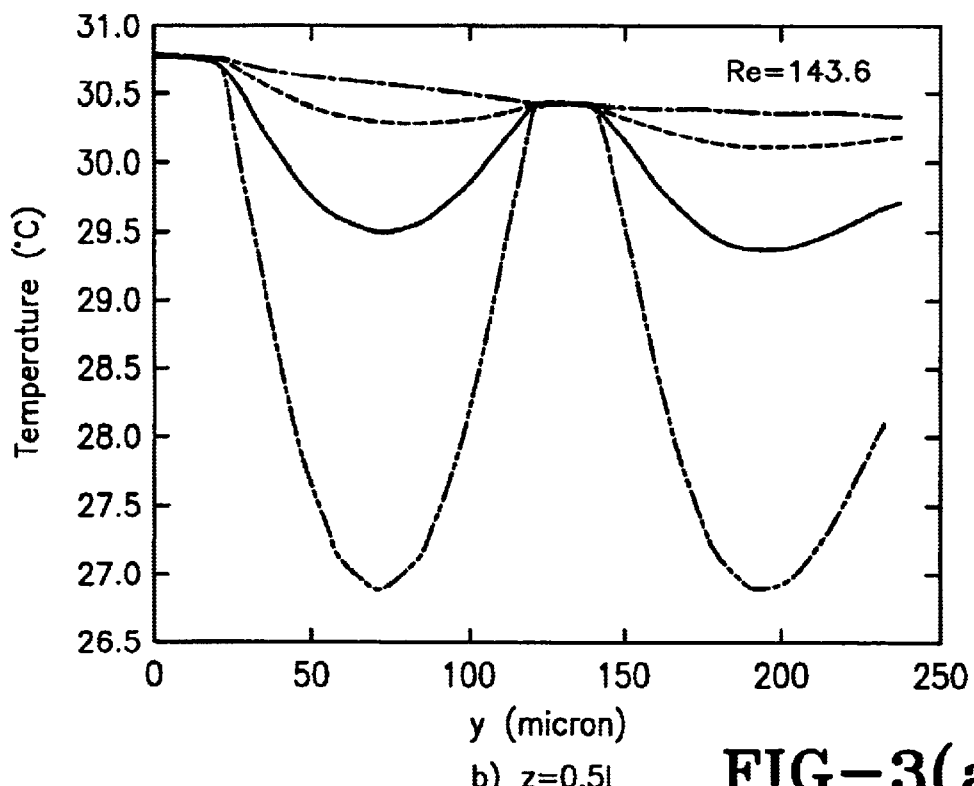
Figure 3B:
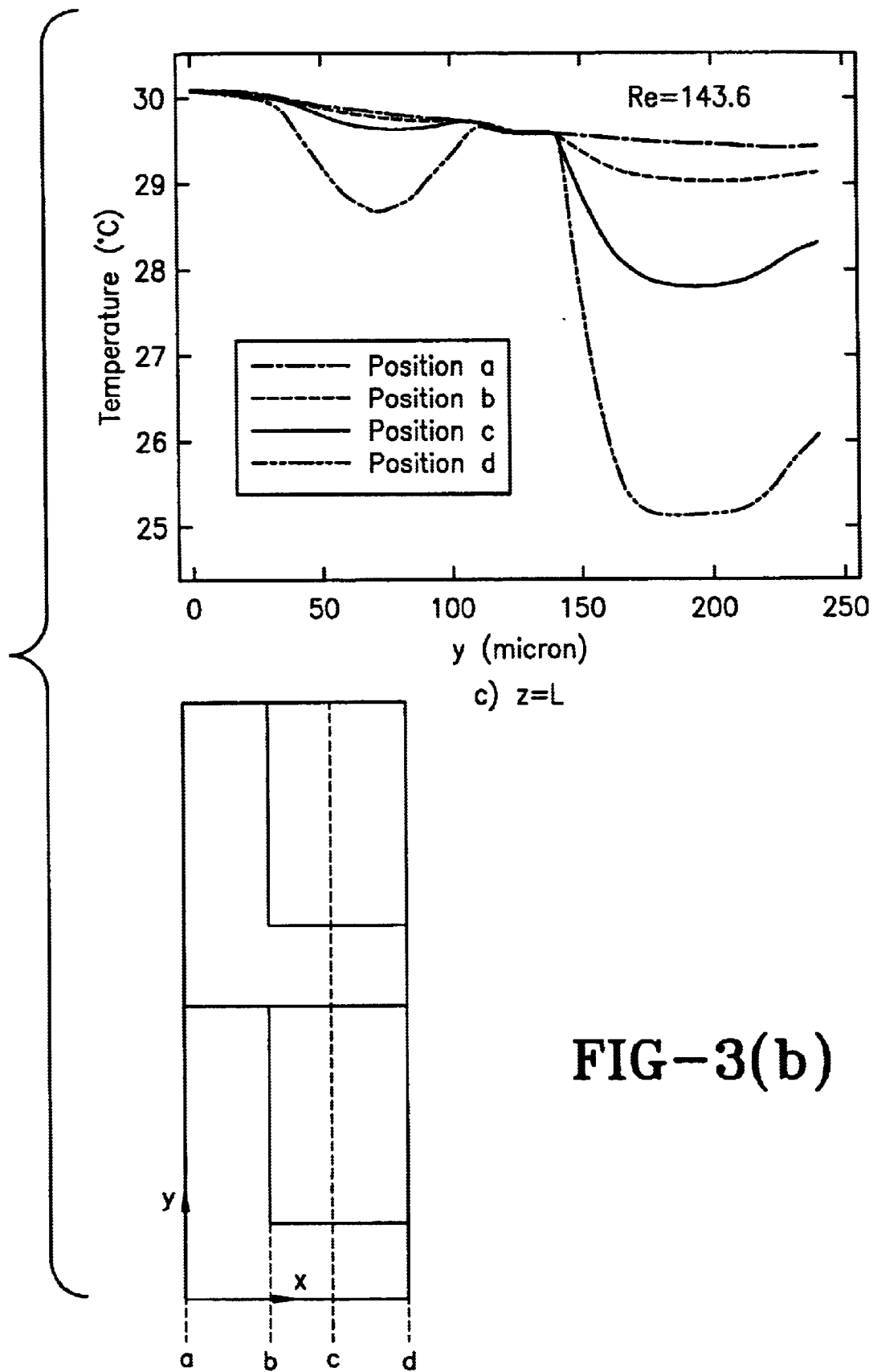

The temperature profiles in the y direction at various x and z locations are plotted in FIG. 3. The parameters used in generating FIGS. 3, 4, 5 and 6 which are based on some typical generic conditions for these type of applications are listed in Table 1. FIGS. 3a, 3b, 3c correspond to z=0, 0.5L, L which in turn signify the lower layer inlet/upper layer outlet, middle of the channel, and lower layer outlet/upper layer inlet, respectively. The curves in each figure correspond to different x locations labeled as a, b, c and d in FIG. 3.

The temperature in the base section is virtually constant due to the large ratio of the thermal conductivity of silicon to water. This implies that the conduction contribution to the overall thermal resistance in the y direction is insignificant and the thickness of the silicon at the base is not a crucial factor for the thermal performance of the heat sink. The fluid temperature in the central channel domain is basically constant until it reaches the boundary layer region at which point the fluid temperature rises rapidly towards the solid surface temperature.

Due to the conduction effect on the coolant, the upper and lower layers of the fluid have apparent temperature difference. At the two ends of the channels, there are regions where the outlet coolant temperature for one layer is higher than the temperature of the surrounding substrate cooled by the other coolant layer at its inlet. This implies that for each layer, heat dissipates from substrate to coolant at its inlet, as it does in one layered micro-channel heat sink, but in addition heat transfer also occurs from the heated coolant to the substrate around its outlet. This feature is unique and occurs only in the two-layered heat sink design. It is also observed that temperature distribution in the y direction at various z positions is quite different. For example, the temperature in solid domain remains almost constant with height in FIGS. 3b and 3c, but in FIG. 3a, it drops only until the mid-section of the lower channel and then it increases gradually with height. This is also different from a one-layered structure where the temperature profile should be invariant in streamwise distance.

Figure 4A:
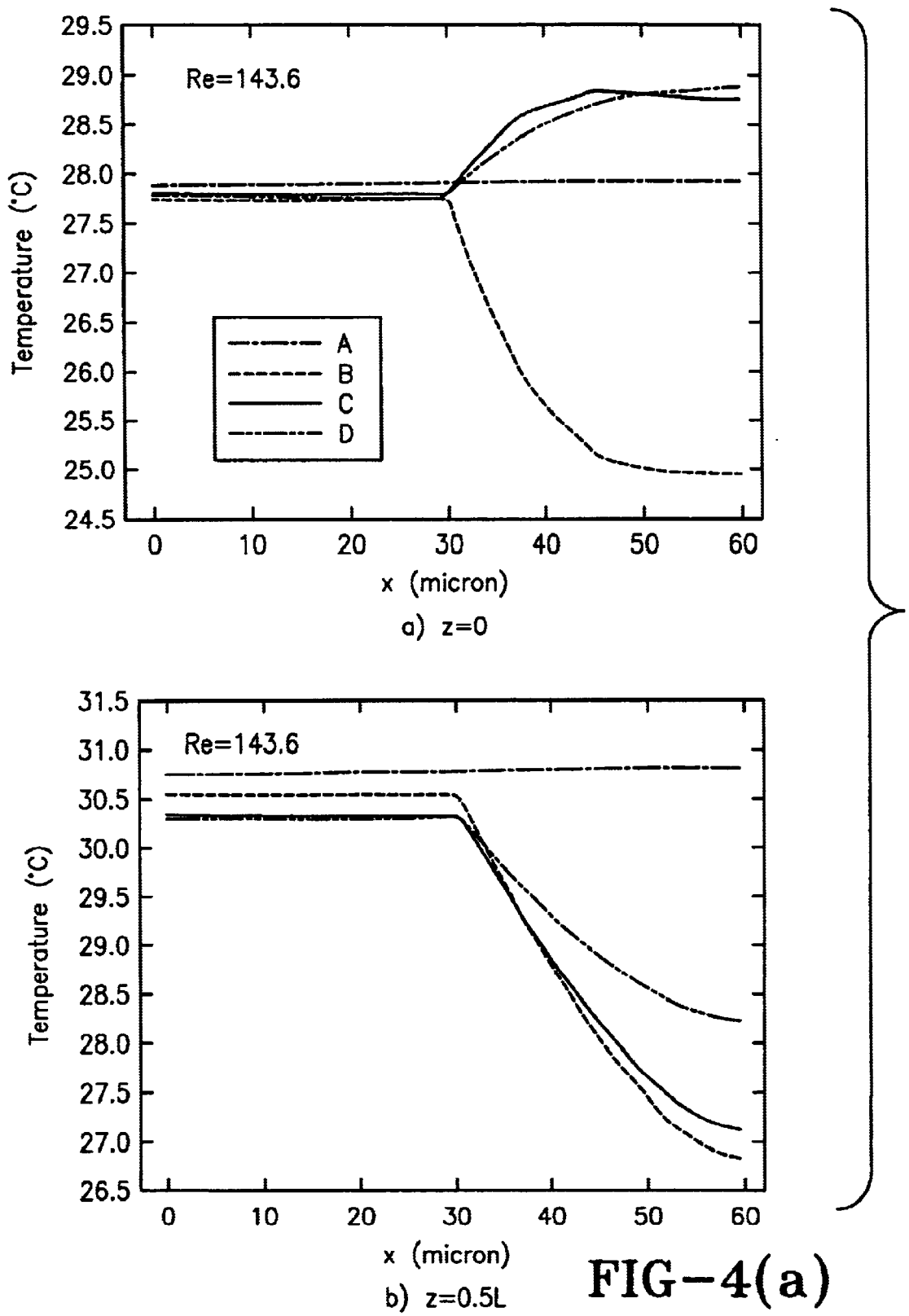
FIG. 4 shows the temperature distribution in x direction in accordance with the present invention.
Figure 4B:
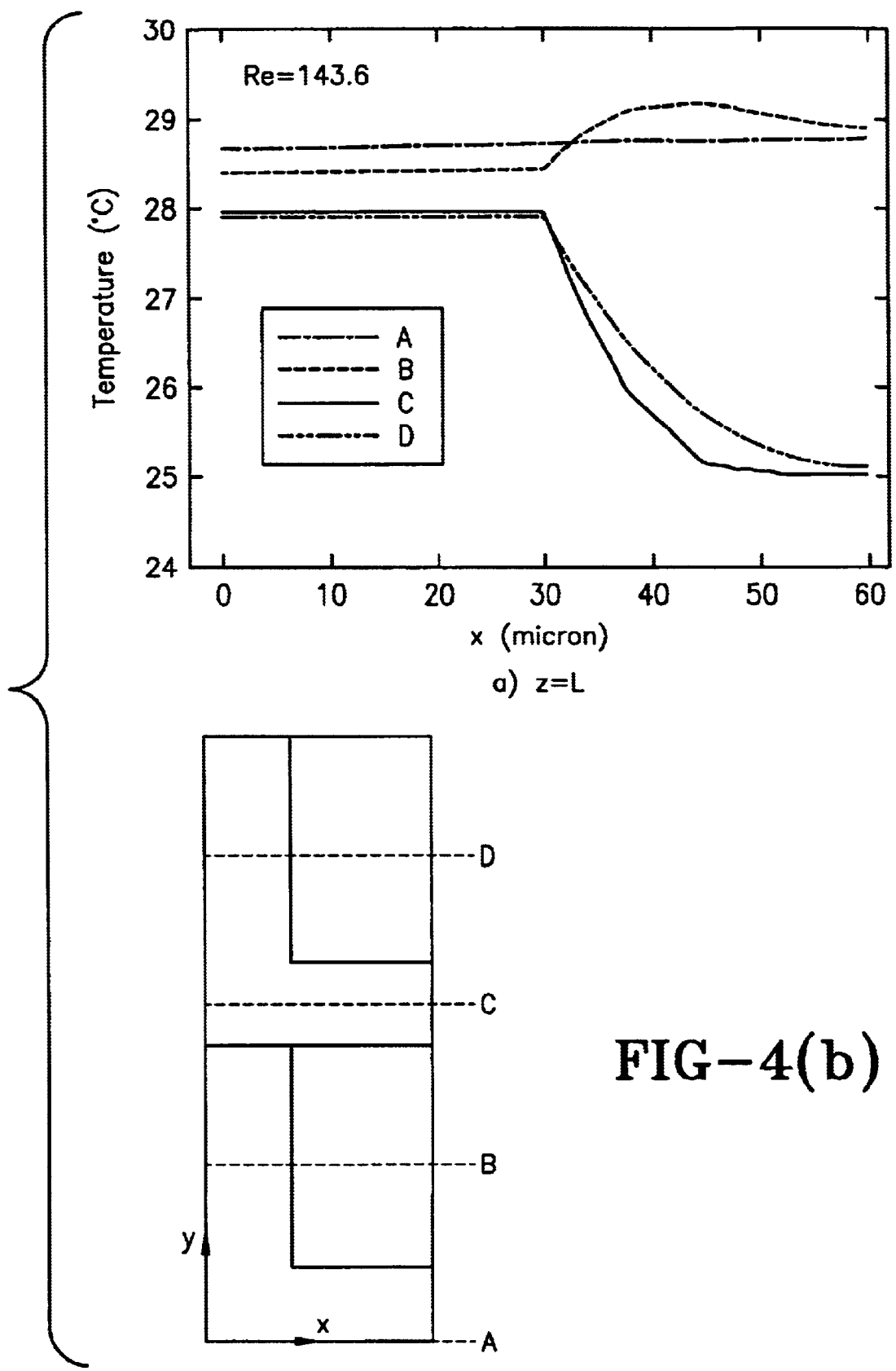

Temperature profiles in the x direction are plotted in FIG. 4. FIGS. 4a, 4b and 4c correspond to different z positions of 0, 0.5L, and L respectively. The curves in each figure correspond to different y locations labeled as A, B, C and D in FIG. 4. All curves in FIG. 4 change abruptly at the interface between the fin and the channel. The temperature profiles at the base of the lower layer, as represented by the curves in FIGS. 4a and 4b, display a temperature increase from the central surface of the fin to the central surface of the channel. This is indicative of a heat flux parallel to the base surface, the direction of which is from the channel side to the fin side.

Figure 5:
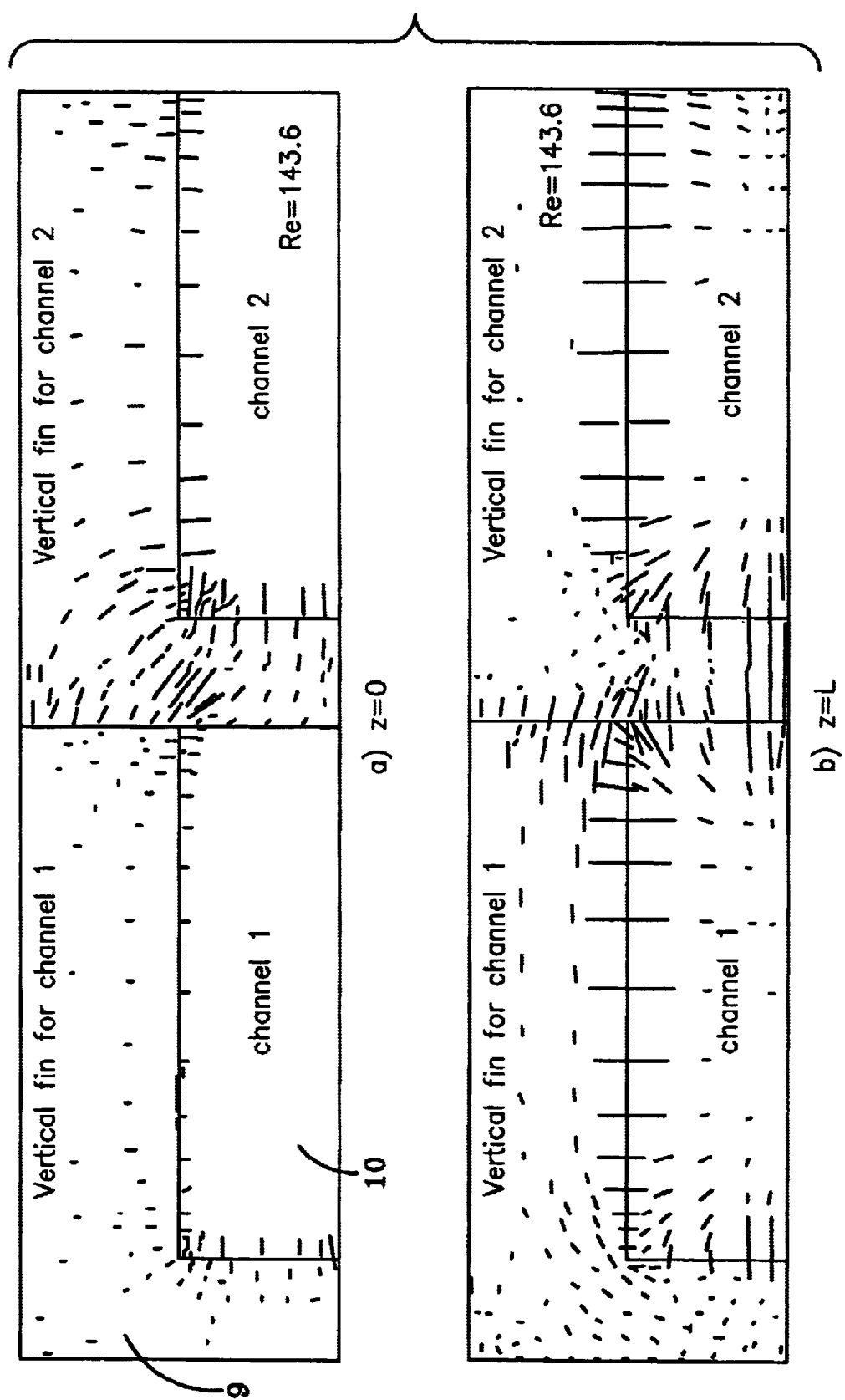
FIG. 5 shows heat flux vector plots at z=O and z=L for Re=143.6 in accordance with the present invention.

The heat flux paths suggested in FIG. 4 can be seen clearly in the heat flux vector plots displayed in FIG. 5. FIG. 5 illustrates that the heat input at the bottom surface of the heat sink is dissipated in two ways: a "direct" path which is by conduction through the base layer and convection from the lower layer of the channel; and an "indirect" path which is by conduction through the vertical fin and the upper base layer as well as convection from the upper layer channel. As seen in FIG. 5, the "direct" path dominates the heat transfer process around z=0 whereas around z=L the main heat flux flows through the "indirect" path. This is because around z=0, as seen in FIG. 5a, which corresponds to the lower channel inlet and the upper channel outlet, the coolant in the lower channel is cooler than that in the upper channel, so the "direct" heat flux path is more significant than the "indirect" path. The opposite scenario is the case around z=L as seen in FIG. 5b where the heat flux along the "indirect" path is dominant.

Figure 6A:
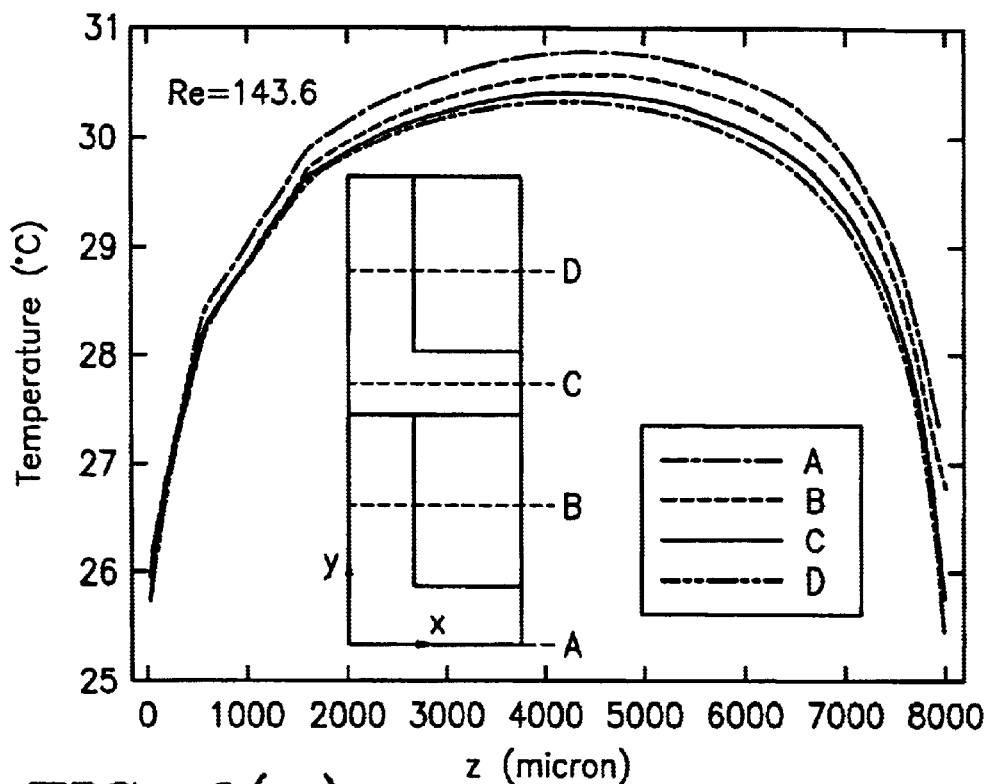
FIG. 6 shows a) the temperature distribution in streamwise (z) direction for a two-layered micro-channel heat sink and b) the temperature distribution in streamwise (z) direction for a one-layered micro-channel heat sink in accordance with the present invention.
Figure 6B:
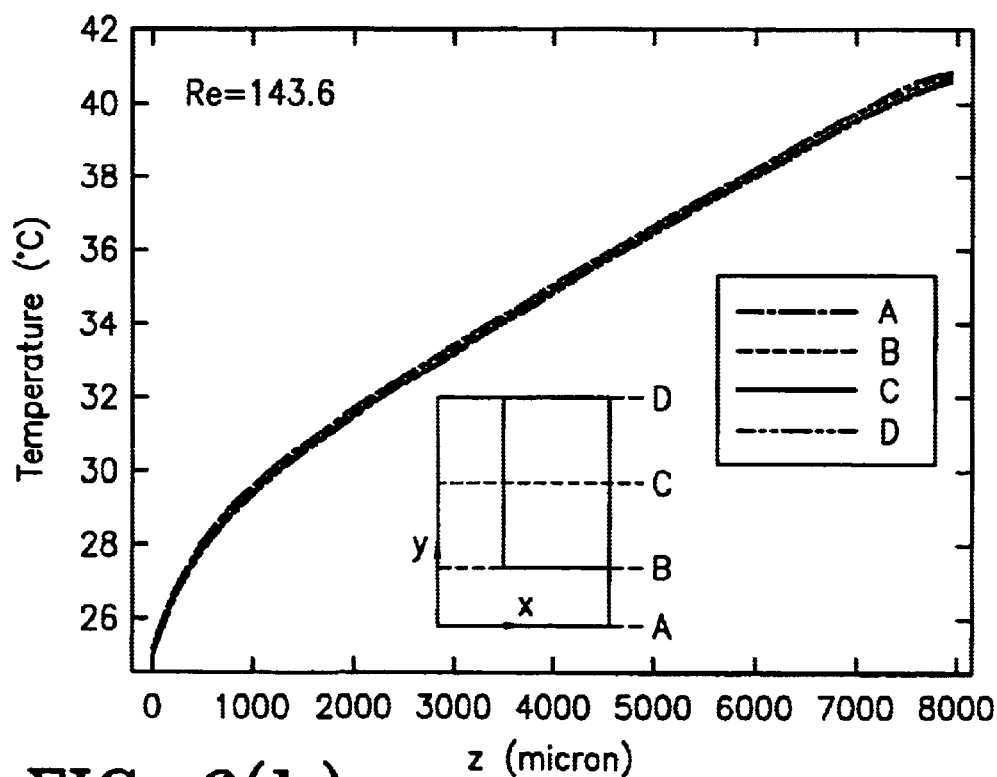

FIGS. 6a shows the temperature distribution along the channels, corresponding to the central surface of the fin. The four curves in FIG. 6a correspond to different y. locations labeled as A, B, C and D. The results for the streamwise temperature distribution within the one-layered channel structure is shown in FIG. 6b. For comparative purposes, the pressure drop and other parameters are kept the same as those used in the two-layered structure.

As shown in FIG. 6a, the streamwise temperature distribution at different y positions, denoted by the curves A to D, are close to each other, with maximum value occurring approximately at the center of the channels regardless of the y location. The maximum temperature difference in the streamwise direction in the two-layered structure is around 5° C. as seen in FIG. 6a. The benefits of the two layered micro-channel system become apparent when the maximum temperature difference for the two layered system shown in FIG. 6a is compared with that for the one layered channel shown in FIG. 6b. As seen in FIG. 6b, the maximum temperature difference for the one layered micro-channel system is about 15° or about 300% higher than that for the two-layered micro-channel system for the same set of parameters. Therefore, the two-layered micro-channel heat sink can reduce the streamwise temperature difference more effectively than the traditional one-layered design.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, it will be within the ability of one of ordinary skill in the art to make alterations or modifications to the present invention, such as through the substitution of equivalent materials or structural arrangements, or through the use of equivalent process steps, so as to be able to practice the present invention without departing from its spirit as reflected in the appended claims, the text and teaching of which are hereby incorporated by reference herein. It is the intention, therefore, to limit the invention only as indicated by the scope of the claims and equivalents thereof.

REFERENCES

1. D. B. Tuckerman and R. F. W. Pease, High-performance heat sinking for VLSI, *IEEE Electron Device Letter* ED-2, 126–129 (1981)
2. L. J. Missaggia, J. N. Walpole, Z. L. Liau and R. J. Phillips, Micro-channel heat sinks for two dimensional high-power-density diode laser arrays, *IEEE Journal of Quantum Electronics* 25,1988–1992 (1989)
3. M. B. Keiner, S. A. Kuhn and K. Haberger, High performance forced air cooling scheme employing micro-channel heat exchangers, *IEEE Trans. On Components, Packaging and Manufacturing Technology* Part A 18, 795–804 (1995)
4. V. K. Samalam, Convective heat transfer in micro-channels, J. of *Electronics Materials* 18, 611–17 (1989)
5. A. Weisberg, H. H. Bau and J. Zemel, Analysis of micro-channels for integrated cooling, *Int. J. Heat & Mass Transfer* 35, 2465–74 (1992)
6. M. B. Bowers and I. Mudawar, Two-phase electronic cooling using mini-channel and micro-channel heat sinks: part I- design criteria and heat diffusion constraints, *Trans. of the ASME, J. of Electronic Packaging* 116, 290–7 (1994)
7. R. W. Knight, D. J. Hall, J. S. Goodling, and R. C. Jaeger, Heat sink optimization with application to micro-channels, *IEEE Trans. Components, Hybrids and Manufacturing Technology* 15, 83242 (1992)
8. Vafai, K. and Zhu, L., "Analysis of a Two-Layered Micro-Channel Heat Sink Concept in Electronic Cooling" International Journal of Heat and Mass Transfer,42, 2287–2297 (1999)
9. Lee, D. Y., and Vafai, K., "Comparative Analysis of Jet Impingement and Microchannel Cooling for High Heat Flux Applications" International Journal of Heat and Mass Transfer, 42, 1555–1568 (1999)

What is claimed is:

1. A multi-layer micro-channel heat sink for use with a heat generating surface, said micro-channel heat sink comprising:

at least three layers, each said layer adjacent to and in thermal communication with at least one other said layer, wherein one said layer is adjacent to and in thermal communication with said heat generating surface, each said layer comprising an input, an output and at least one micro-channel for transporting a coolant from said input to said output of a respective layer, wherein each said layer is configured such that coolant flowing through said layer flows in a different direction than coolant flowing through an adjacent layer;

a flow splitter, said flow splitter in fluid communication with each said input, said flow splitter adapted to receive a common flow of coolant and to deliver coolant to each said input;

a flow combiner, said flow combiner in fluid communication with each said output, said flow combiner adapted to receive coolant from each said output and combine said received coolant into a common flow of coolant; and a coolant circulating device for supplying said flow splitter with a common flow of coolant and for receiving said common flow of coolant from said flow combiner so as to circulate coolant across each said layer of said plurality of layers.

2. A multi-layer micro-channel heat sink according to claim 1 further comprising a cooling device attached to said coolant circulating device whereby excess heat is removed from said coolant.

3. A multi-layer micro-channel heat sink according to claim 1 further comprising a heat exchanging device attached to said coolant circulating device whereby excess heat is removed from said coolant.

4. A multi-layer micro-channel heat sink according to claim 1 further comprising a coolant filter attached to said coolant circulating device whereby impurities may be removed from said coolant.

5. A multi-layer micro-channel heat sink according to claim 1 further comprising a coolant reservoir in fluid communication with said coolant circulating device whereby coolant can be stored for later use in said multi-layer micro-channel heat sink.

6. A multi-layer micro-channel heat sink according to claim 1 wherein said multi-layer micro-channel heat sink is constructed from silicon.

7. A multi-layer micro-channel heat sink according to claim 1 wherein said micro-channels individually comprise dimensions less than one-sixteenth of an inch in width and height and proportional to said heat generating surface in length.

8. An electronic device with multi-layer micro-channel heat sink, said electronic device comprising:

electronic circuitry capable of generating heat;

at least three layers, each said layer adjacent to and in thermal communication with at least one other said layer, wherein one said layer is adjacent to and in thermal communication with said electronic circuitry, each said layer comprising an input, an output and at least one micro-channel for transporting a coolant from said input to said output of a respective layer, wherein each said layer is configured such that coolant flowing through said layer flows in a different direction than coolant flowing through an adjacent layer;

a flow splitter, said flow splitter in fluid communication with each said input, said flow splitter adapted to receive a common flow of coolant and to deliver coolant to each said input;

a flow combiner, said flow combiner in fluid communication with each said output, said flow combiner adapted to receive coolant from each said output and combine said received coolant into a common flow of coolant; and a coolant circulating device for supplying said flow splitter with a common flow of coolant and for receiving said common flow of coolant from said flow combiner so as to circulate coolant across each said layer of said plurality of layers.

9. An electronic device according to claim 8 further comprising a cooling device attached to said coolant circulating device whereby excess heat is removed form said coolant.

10. An electronic device according to claim 8 further comprising a heat exchanging device attached to said coolant circulating device whereby excess heat is removed by said coolant.

11. An electronic device according to claim 8 further comprising a coolant filter attached to said coolant circulating device whereby impurities may be removed from said coolant.

12. An electronic device according to claim 8 further comprising a coolant reservoir attached to said coolant circulating device whereby coolant can be stored for later use in said multi-layer micro-channel heat sink.

13. An electronic device according to claim 8 wherein said multi-layer micro-channel heat sink comprises a heat-conducting material.

14. An electronic device according to claim 13 wherein said heat-conducting material is silicon.

15. An electronic device according to claim 8 wherein said micro-channels individually comprise dimensions less than one-sixteenth of an inch in width and height and proportional to said electronic circuitry in length.

* * * * *

UNITED STATES PATENT AND TRADEMARK OFFICE
CERTIFICATE OF CORRECTION

PATENT NO. : 6,675,875 B1
DATED : January 13, 2004
INVENTOR(S) : Vafai et al.

It is certified that error appears in the above-identified patent and that said Letters Patent is hereby corrected as shown below:

Column 4,
Line 3, please delete "preferred two-layered heat sink" and insert -- preferred three-layered heat sink --.
Line 18, please delete "coolant the passes through a cooler 19" and insert -- coolant that passes through cooler 19 --
Line 57, please delete "ps Materials and Methods"
Line 58, insert -- Materials and Methods: --

Column 6,
Line 1, please delete "C./cmW to 11.40° C./cmW" and insert -- C/cmW to 11.40° C/cm W --
Line 27, please delete "8000 $\mu$um" and insert -- 8000 $\mu$m --
Line 42, please delete "Discussion" and insert -- Discussion: --
Line 61, please delete "$\nabla v^2 T=0$" and insert -- $\nabla^2 T = 0$ --

Column 7,
Line 6, please delete "$pc_\rho c_p(\partial T/\partial z)=k\nabla^2 T+\mu[(\partial w/\partial x)^2+(\partial w/ay)^2]$" and insert -- $w\rho c_p(\partial T/\partial z) = k\nabla^2 T + \mu[(\partial w/\partial x)^2 + (\partial w/ay)^2]$ --

Line 13, please delete " " and insert 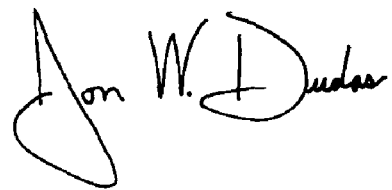 --

Column 9,
Line 61, please delete "Technology 15, 83242" and insert -- Technology 15, 832-42 --

Signed and Sealed this

Fifteenth Day of June, 2004

JON W. DUDAS
*Acting Director of the United States Patent and Trademark Office*